US012809331B2

(12) United States Patent
Komukai

(10) Patent No.: US 12,809,331 B2
(45) Date of Patent: Nov. 24, 2026

(54) BONDING METHOD, BONDING APPARATUS AND ARTICLE MANUFACTURING METHOD

(71) Applicant: CANON KABUSHIKI KAISHA, Tokyo (JP)

(72) Inventor: Akifumi Komukai, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 183 days.

(21) Appl. No.: 18/768,260

(22) Filed: Jul. 10, 2024

(65) Prior Publication Data

US 2025/0028295 A1 Jan. 23, 2025

(30) Foreign Application Priority Data

Jul. 20, 2023 (JP) ................................ 2023-118516

(51) Int. Cl.
*H10P 72/70* (2026.01)
*G05B 19/19* (2006.01)

(52) U.S. Cl.
CPC .... *G05B 19/19* (2013.01); *G05B 2219/39106* (2013.01); *H10P 72/7402* (2026.01)

(58) Field of Classification Search
CPC .......... G05B 19/19; G05B 2219/39106; H10P 72/7402
See application file for complete search history.

(56) References Cited

U.S. PATENT DOCUMENTS

2002/0092622 A1 7/2002 Aoki
2003/0024964 A1 * 2/2003 Fujiwara ............. H10P 72/0446 228/49.1
2012/0135096 A1 5/2012 Maeyama et al.

FOREIGN PATENT DOCUMENTS

JP 2000-68296 A 3/2000
JP 2004214453 A * 7/2004
TW 201727846 A 7/2024

OTHER PUBLICATIONS

Sep. 21, 2026 Office Action in Taiwanese Patent Application No. 113124684 (with English translation).

* cited by examiner

*Primary Examiner* — Michael W Choi
(74) *Attorney, Agent, or Firm* — Venable LLP

(57) ABSTRACT

A bonding method of conveying a plurality of carriers and a plurality of substrates and boding a first object and a second object, the plurality of carriers each holding a plurality of first objects, the plurality of substrates each having a plurality of second objects formed thereon, the method including obtaining rank information including data indicating ranks of the respective first objects for each of the plurality of carriers and data indicating ranks of the respective second objects for each of the plurality of substrates, deciding, based on the rank information, a conveyance order of the plurality of carriers and a conveyance order of the plurality of substrates, and conveying the plurality of carriers and the plurality of substrates to the bonding apparatus in accordance with the conveyance orders decided in the deciding, and bonding the first object and the second object.

14 Claims, 5 Drawing Sheets

| | DICING FRAME D11 | DICING FRAME D12 |
|---|---|---|
| NUMBER OF NON-DEFECTIVE DIES | 25 | 22 |
| NUMBER OF DEFECTIVE DIES | 5 | 8 |

| | WAFER W11 | WAFER W12 | WAFER W13 |
|---|---|---|---|
| NUMBER OF NON-DEFECTIVE DIES | 14 | 16 | 17 |
| NUMBER OF DEFECTIVE DIES | 6 | 4 | 3 |

| | DICING FRAME D21 | DICING FRAME D22 |
|---|---|---|
| NUMBER OF NON-DEFECTIVE DIES | 23 | 24 |
| NUMBER OF DEFECTIVE DIES | 7 | 6 |

| | WAFER W21 | WAFER W22 | WAFER W23 |
|---|---|---|---|
| NUMBER OF NON-DEFECTIVE DIES | 18 | 17 | 12 |
| NUMBER OF DEFECTIVE DIES | 2 | 3 | 8 |

BONDING METHOD, BONDING APPARATUS AND ARTICLE MANUFACTURING METHOD

BACKGROUND OF THE INVENTION

Field of the Invention

The present invention relates to a bonding method, a bonding apparatus and an article manufacturing method.

Description of the Related Art

Japanese Patent Laid-Open No. 2000-68296 proposes a technique of, in a bonding apparatus, improving the yield of an article (device or the like), which is manufactured by bonding the first object and the second object, by bonding non-defective objects together and bonding defective objects together when bonding the first object and the second object.

However, if there is an imbalance in the number of non-defective objects between the conveyance units of the first objects and the conveyance units of the second objects sequentially supplied to the bonding apparatus, the conventional technique sometimes needs to perform bonding not only in a combination of non-defective objects but also in a combination of a non-defective object and a defective object. In this manner, in the conventional technique, it is not always possible to obtain a sufficient effect of improving the yield.

SUMMARY OF THE INVENTION

The present invention provides a technique advantageous in improving the yield of a bonded object obtained by bonding the first object and the second object.

According to one aspect of the present invention, there is provided a bonding method of conveying a plurality of carriers and a plurality of substrates to a bonding apparatus and boding a first object and a second object, the plurality of carriers each holding a plurality of first objects, the plurality of substrates each having a plurality of second objects formed thereon, the method including obtaining rank information including data indicating ranks of the respective first objects for each of the plurality of carriers and data indicating ranks of the respective second objects for each of the plurality of substrates, deciding, based on the rank information, a conveyance order of the plurality of carriers and a conveyance order of the plurality of substrates, and conveying the plurality of carriers and the plurality of substrates to the bonding apparatus in accordance with the conveyance orders decided in the deciding, and bonding the first object and the second object.

Further aspects of the present invention will become apparent from the following description of exemplary embodiments with reference to the attached drawings.

DESCRIPTION OF THE EMBODIMENTS

Figure 1:
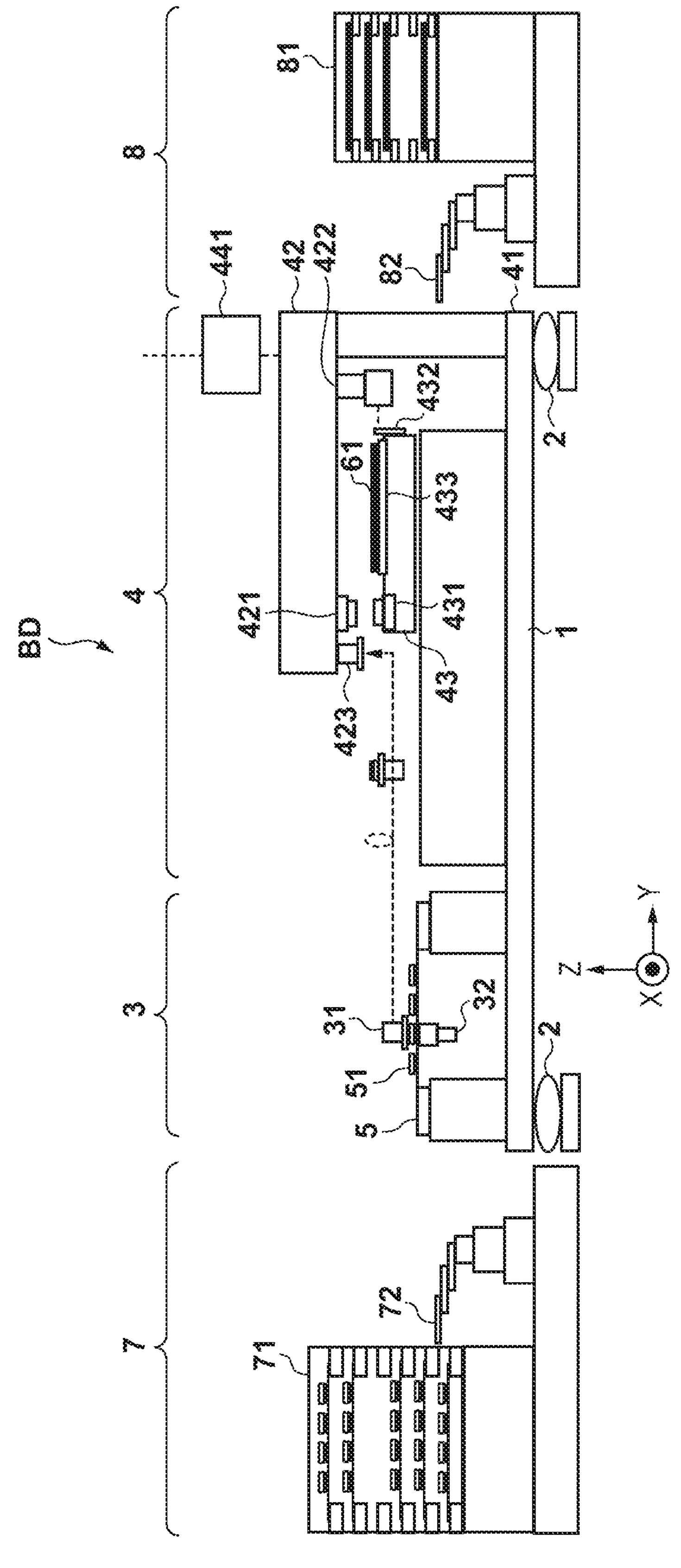
FIG. 1 is a view schematically showing the arrangement of a bonding apparatus as one aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A description will be given below assuming that a carrier (first carrier) is a dicing frame holding (mounted with) a plurality of separated dies (first objects) on each of which a semiconductor device has been formed, and a substrate (second carrier) is a wafer on which a plurality of dies (second objects) each including a semiconductor device have been formed. However, the carrier and substrate are not limited to this.

The first object includes, in addition to the separated die, for example, a stack of some already separated dies, a small piece of a material, an optical element, a MEMS, a structure, or the like.

The second object includes, in addition to the die of the semiconductor device formed on the wafer, for example, a silicon interposer as a silicon wafer with wirings formed thereon, and a glass interposer as a glass wafer with wirings formed thereon. The second object also includes an organic interposer as an organic panel (PCB) with wirings formed thereon, a wafer formed with a semiconductor device, to which some dies including semiconductor devices have already been bonded, and the like.

The bonding method of the first object and the second object is also not limited. The bonding method of the first object and the second object includes, for example, bonding using an adhesive agent, temporary bonding using a temporary adhesive agent, bonding by hybrid bonding, atomic diffusion bonding, vacuum bonding, bump bonding, and the like. In this manner, the bonding method of the first object and the second object includes various temporary bonding methods and permanent bonding methods.

Industrial application examples of the bonding apparatus as one aspect of the present invention are, for example, application examples described below.

The first application example is manufacturing of a stacked memory. When the bonding apparatus as one aspect of the present invention is applied to manufacturing of a stacked memory, the first object is a separated memory die, and the second object is a memory die as a semiconductor device formed on a wafer. In manufacturing of a stacked memory, in general, about eight layers are stacked. Hence, in bonding of the eighth layer, the second object is a substrate as the wafer to which six layers of memory dies have already been bonded. Note that the final layer may be a driver die for driving the memories.

The second application example is heterogeneous integration of a processor. The mainstream of a conventional processor is an SoC obtained by forming a logic circuit and an SRAM in one semiconductor element. To the contrary, in heterogeneous integration, respective elements are manufactured on separate wafers while applying a process optimal for each element, and bonded to manufacture a processor. This can implement cost reduction and yield improvement of the processor. When the bonding apparatus as one aspect of the present invention is applied to heterogeneous integration, the first object is a die such as an SRAM, an antenna, or a driver separated after probing. The second object is a logic die as a semiconductor device formed on the wafer. Normally, different dies are sequentially bonded. Hence, the bonded objects on the second object sequentially increase. For example, in a case of starting bonding from an SRAM, when bonding the die next to the SRAM, the logic wafer with the SRAM bonded thereto serves as the second object.

The third application example is 2.5D bonding using a silicon interposer. The silicon interposer is a silicon wafer with wirings formed thereon. The 2.5D bonding is a method of bonding separated dies using the silicon interposer, thereby electrically bonding the dies. When the bonding apparatus as one aspect of the present invention is applied to die bonding to the silicon interposer, the first object is a separated die, and the second object is a silicon interposer as a silicon wafer with wirings formed thereon. In general, a plurality of types of dies are bonded to the silicon interposer. Hence, the second object also includes a silicon interposer with several dies bonded thereto.

The fourth application example is 2.1D bonding using an organic interposer or a glass interposer. The organic interposer is an organic panel (PCB substrate or CCL substrate) used as a package substrate, on which wirings are formed. The glass interposer is a glass panel with wirings formed thereon. The 2.1D bonding is a method of bonding separated dies to the organic interposer or the glass interposer, thereby electrically bonding the dies by the wirings on the interposer. When the bonding apparatus as one aspect of the present invention is applied to die bonding to the organic interposer, the first object is a separated die, and the second object is an organic panel formed with wirings. When the bonding apparatus as one aspect of the present invention is applied to die bonding to the glass interposer, the first object is a separated die, and the second object is a glass panel formed with wirings. In general, a plurality of types of dies are bonded to the organic interposer or the glass interposer. Hence, the second object also includes an organic interposer or a glass interposer with several dies bonded thereto.

The fifth application example is heterogeneous substrate bonding. For example, in the field of infrared image sensors, InGaAs is known as a high sensitivity material. Accordingly, if InGaAs is used for a sensor unit that receives light, and silicon capable of implementing high-speed processing is used for a logic circuit that extracts data, a high-sensitivity high-speed infrared image sensor can be manufactured. However, from InGaAs crystal, only substrates (wafers) whose diameter is as small as 4 inches are mass-produced, which is smaller than a mainstream silicon wafer having a size of 300 mm. Hence, a technique of bonding a separated InGaAs substrate to a 300-mm silicon wafer with a logic circuit formed thereon has been proposed. The bonding apparatus as one aspect of the present invention can also be applied to heterogeneous substrate bonding for bonding substrates made of different materials and having different sizes. When the bonding apparatus as one aspect of the present invention is applied to heterogeneous substrate bonding, the first object is a small piece of a material such as InGaAs, and the second object is a substrate such as a silicon wafer with a large diameter. Note that the small piece of the material is a slice of a crystal. The piece is preferably cut into a rectangular shape.

First Embodiment

FIG. 1 is a view schematically showing the arrangement of a bonding apparatus BD as one aspect of the present invention. The bonding apparatus BD bonds a separated die 51 (first object) to an arbitrary position on a wafer 6 (second carrier) serving as a substrate. The die 51 is provided while being arrayed (held) on a dicing tape put on a dicing frame 5 (first carrier). In this specification, as shown in respective drawings, directions are indicated on an XYZ coordinate system. Typically, an XY plane is a plane parallel to the horizontal plane, and a Z-axis is an axis parallel to the vertical direction. X-, Y-, and Z-axes are examples of directions that are orthogonal to each other or cross each other.

As shown in FIG. 1, the bonding apparatus BD includes a pickup unit 3 and a bonding unit 4, which are arranged on a base 1 damped by mounts 2, a frame supply unit 7, and a wafer supply unit 8. The pickup unit 3, the bonding unit 4, the frame supply unit 7, and the wafer supply unit 8 function as a bonding unit for bonding the die 51 to the wafer 6 (a die 61 thereof). In this embodiment, the pickup unit 3 and the bonding unit 4 are arranged on one base 1. However, the pickup unit 3 and the bonding unit 4 may individually be arranged on separate bases.

The frame supply unit 7 includes a frame magazine 71 and a frame conveyance arm 72. The frame magazine 71 is formed to be detachable, and supplied from outside the apparatus while storing (mounted with) a plurality of dicing frames 5. The frame conveyance arm 72 takes out the dicing frame 5 from the frame magazine 71, and conveys (passes) the dicing frame 5 to the pickup unit 3. Further, the frame conveyance arm 72 conveys (returns) the dicing frame 5 completed with a bonding process from the pickup unit 3 to the frame magazine 71. Note that, in this embodiment, only one frame conveyance arm 72 conveys the dicing frame 5, but a plurality of frame conveyance arms 72 may relay the dicing frame 5. Furthermore, from the viewpoint of shortening the exchange time of the frame magazine 71 and the conveyance time of the dicing frame 5, the bonding apparatus BD may include a plurality of frame supply units 7.

The wafer supply unit 8 includes a wafer pod 81 and a wafer conveyance arm 82. The wafer pod 81 is formed to be detachable, and supplied from outside the apparatus while storing (mounted with) a plurality of wafers 6. The wafer conveyance arm 82 takes out the wafer 6 from the wafer pod 81, and conveys (passes) the wafer 6 to the bonding unit 4. Further, the wafer conveyance arm 82 conveys (returns) the wafer 6 completed with a bonding process from the bonding unit 4 to the wafer pod 81. Note that, in this embodiment, only one wafer conveyance arm 82 conveys the wafer 6, but a plurality of wafer conveyance arms 82 may relay the wafer 6. In order to increase the cleanliness, after the wafer 6 is loaded to the bonding apparatus BD, the wafer 6 may pass through a mechanism for cleaning the wafer 6 inside the bonding apparatus BD and a mechanism for executing preprocessing for bonding. Furthermore, from the viewpoint of shortening the exchange time of the wafer pod 81 and the conveyance time of the wafer 6, the bonding apparatus BD may include a plurality of wafer supply units 8.

In this embodiment, as shown in FIG. 1, the frame supply unit 7 and the wafer supply unit 8 are arranged at positions separated from each other, but the present invention is not limited to this. For example, from the viewpoint of space saving of the apparatus, the frame supply unit 7 and the wafer supply unit 8 may be arranged adjacent to each other and partially share the frame conveyance arm 72, the wafer conveyance arm 82, and a conveyance path including them.

The pickup unit 3 includes a pickup head 31 and a release head 32. The pickup unit 3 peels the die 51 to be bonded to the wafer 6 from the dicing tape by the release head 32, and holds the die 51 peeled from the dicing tape by sucking (chucking) it with the pickup head 31. The pickup head 31 rotates the die 51 by, for example, 180° and passes it to a bonding head 423 of the bonding unit 4.

The bonding unit 4 includes a stage base 41 and an upper base 42. A wafer stage 43 is mounted on the stage base 41. The wafer stage 43 is configured to be capable of driving concerning the X direction and the Y direction by a driving mechanism (not shown) such as a linear motor. The wafer stage 43 may be configured to be capable of driving concerning a rotation about an axis parallel to the Z direction. Instead of driving the wafer stage 43 concerning the rotation about the axis parallel to the Z direction, the bonding head 423 may drive the die 51 concerning the rotation about the axis parallel to the Z direction.

A die observation camera 431 is provided on the wafer stage 43. The die observation camera 431 obtains an image by capturing the die 51 held by the bonding head 423. From the image obtained by the die observation camera 431, a control unit 441 obtains the position of the feature point (portion) of the die 51 held by the bonding head 423, the outer diameter dimension of the die 51, and the height-direction (Z-direction) distances of a plurality of points of the measurement surface of the die 51 (the flatness of the die 51). In this manner, the die observation camera 431 cooperates with the control unit 441, thereby implementing a function of measuring the position of the feature point of the die 51, the outer diameter dimension of the die 51, and the flatness of the die 51.

A bar mirror 432 is provided on the wafer stage 43. The bar mirror 432 is used as the target of an interferometer 422. The wafer stage 43 holds the wafer 6 via a wafer chuck 433.

A wafer observation camera 421 is provided on the upper base 42. The wafer observation camera 421 obtains an image by capturing the wafer 6 held by the wafer stage 43 (wafer chuck 433). From the image obtained by the wafer observation camera 421, the control unit 441 obtains the position of the feature point (portion) of the die 61 of the wafer 6 held by the wafer stage 43, and the height-direction (Z-direction) distances of a plurality of points of the measurement surface of the wafer 6 (the flatness of the wafer 6). In this manner, the wafer observation camera 421 cooperates with the control unit 441, thereby implementing a function of measuring the position of the feature point (portion) of the die 61 of the wafer 6 and the flatness of the wafer 6. The wafer observation camera 421 may be a camera capable of measuring an element pattern or mark formed on the wafer or inside the wafer by using infrared light as measurement light.

The upper base 42 is further provided with the interferometer 422 for measuring the position of the wafer stage 43 using the bar mirror 432, and the bonding head 423 for holding the die 51 passed from the pickup head 31.

When bonding the die 51 to the wafer 6, for example, the bonding head 423 is driven downward (−Z direction) to bond the die 51 held by the bonding head 423 to the wafer 6 held by the wafer stage 43. Alternatively, the wafer stage 43 or the wafer chuck 433 may be driven upward (+Z direction) to bond the die 51 held by the bonding head 423 to the wafer 6 held by the wafer stage 43.

In this embodiment, the configuration is employed in which the pickup head 31 rotates the die 51 by 180° and passes it to the bonding head 423. However, by providing one or more die holding units between the pickup head 31 and the bonding head 423, the pickup head 31 may pass the die 51 to the die holding unit, and the die holding unit may pass the die 51 to the bonding head 423. Alternatively, a driving mechanism that drives the bonding head 423 may be provided and drive the bonding head 423 such that the bonding head 423 receives the die 51 from the pickup head 31. Note that, in order to improve productivity, the bonding apparatus BD may include a plurality of pickup heads, a plurality of release heads, and a plurality of bonding heads.

The bonding apparatus BD further includes the control unit 441 formed by an information processing apparatus (computer) including a CPU, a memory, and the like. The control unit 441 operates the bonding apparatus BD by comprehensively controlling the respective units of the bonding apparatus BD, for example, the pickup unit 3, the bonding unit 4, the frame supply unit 7, and the wafer supply unit 8 in accordance with a program stored in a memory unit. For example, in this embodiment, the control unit 441 functions as an obtainment unit that obtains rank information (to be described later), and a decision unit that decides the conveyance order of the dicing frames 5 and the conveyance order of the wafers 6.

Figure 2:
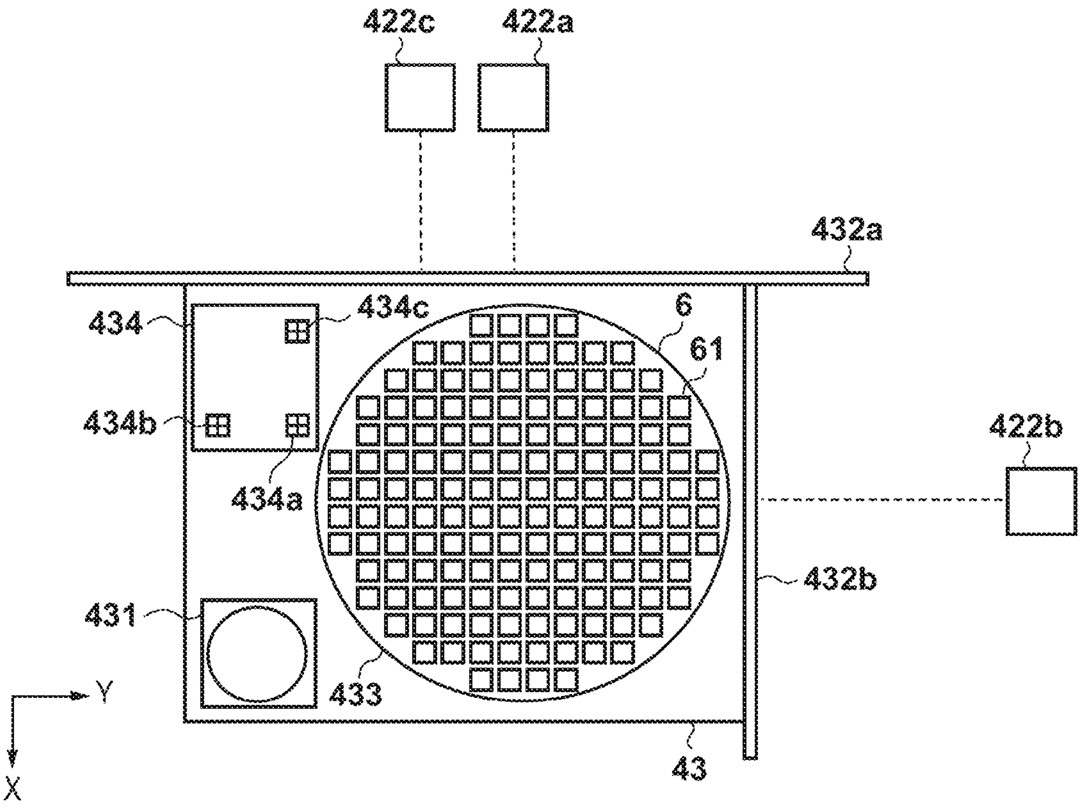
FIG. 2 is a top view showing a wafer stage from the +Z direction.

FIG. 2 is a top view showing the wafer stage 43 from the +Z direction. The wafer 6 is held by the wafer stage 43 via the wafer chuck 433. The wafer 6 or the wafer stage 43 is positioned concerning the X direction and the Y direction, which are orthogonal to each other or cross each other, and the rotation about the axis parallel to the Z direction orthogonal to the X and Y directions. For this purpose, the wafer stage 43 is provided with the bar mirror 432, more specifically, bar mirrors **432*a* and 432*b*. The bar mirror 432*a* is used as the target of interferometers 422*a* and 422*c*. The control unit 441 can obtain the position of the wafer stage 43 in the X direction based on the output from the interferometer 422*a*, and obtain the rotation (rotation amount) of the wafer stage 43 about the axis parallel to the Z direction based on the outputs from the interferometers 422*a* and 422*c*. The bar mirror 432*b* is used as the target of an interferometer 422*b*. The control unit 441 can obtain the position of the wafer stage 43 in the Y direction based on the output from the interferometer 422*b*. Based on the outputs from the interferometers 422*a*, 422*b*, and 422*c*, the control unit 441 feedback-controls the wafer 6 or the wafer stage 43 concerning the X direction, the Y direction, and the rotation about the axis parallel to the Z direction orthogonal to the X and Y directions. In this manner, the interferometer 422 and the control unit 441 function as a positioning mechanism that two-dimensionally accurately positions the wafer 6 or the wafer stage 43**.

A reference plate 434 is provided on the wafer stage 43 (upper surface thereof). In this embodiment, a plurality of marks **434*a*, 434*b*, and 434*c* are arranged (drawn) on the reference plate 434. The reference plate 434 is made of a material with a low thermal expansion coefficient, and the marks 434*a*, 434*b*, and 434*c* are drawn at a high position accuracy. For an example, the reference plate 434 is formed by a quartz substrate, and the marks 434*a*, 434*b*, and 434*c* are drawn thereon using the drawing method of a semiconductor lithography process. The reference plate 434 has a surface with almost the same height as the surface of the wafer 6, and can be observed by the wafer observation camera 421. A camera used to observe the reference plate 434** may separately be provided.

The wafer stage 43 may have a configuration that combines a coarse motion stage that is driven within a large range, and a fine motion stage that is accurately driven within a small range. In this configuration, the die observation camera 431, the bar mirrors 432*a* and 432*b*, the wafer chuck 433, and the reference plate 434 are provided on the fine motion stage to implement accurate positioning.

A method of guaranteeing the origin position, the magnification, and the directions (rotations) and orthogonality of the X-axis and the Y-axis of the wafer stage 43 using the reference plate 434 will be described here. The mark 434*a* is observed by the wafer observation camera 421, and the measured value (output value) of the interferometer when the mark 434*a* is located at the center of the image obtained by the wafer observation camera 421 is defined as the origin of the wafer stage 43. Next, the mark 434*b* is observed by the wafer observation camera 421, and the direction (rotation) of the Y-axis of the wafer stage 43 and the magnification in the Y direction are decided based on the measured value of the interferometer when the mark 434*b* is located at the center of the image obtained by the wafer observation camera 421. Next, the mark 434*c* is observed by the wafer observation camera 421, and the direction (rotation) of the X-axis of the wafer stage 43 and the magnification in the X direction are decided based on the measured value of the interferometer when the mark 434*c* is located at the center of the image obtained by the wafer observation camera 421.

In this manner, defining the direction from the mark 434*b* of the reference plate 434 to the mark 434*a* as the Y-axis of the bonding apparatus BD, and the direction from the mark 434*c* to the mark 434*a* as the X-axis of the bonding apparatus BD, the directions and orthogonality of the axes can be calibrated. Also, defining the interval between the mark 434*b* and the mark 434*a* as the scale reference of the Y-axis of the bonding apparatus BD and the interval between the mark 434*c* and the mark 434*a* as the scale reference of the X-axis of the bonding apparatus BD, calibration can be performed.

In the interferometer, the refractive index of the optical path changes due to variations of the atmospheric pressure and temperature, and this makes the measured value vary. Therefore, it is preferable to perform calibration at an arbitrary timing and guarantee the origin position, the magnification, and the directions (rotations) and orthogonality of the X-axis and the Y-axis of the wafer stage 43. To reduce the variation of the measured value of the interferometer, the space in which the wafer stage 43 is arranged may be covered with a temperature control chamber to control the temperature in the temperature control chamber.

In this embodiment, a case where the reference plate 434 provided on the wafer stage 43 is observed by the wafer observation camera 421 has been described, but the present invention is not limited thereto. For example, by providing the reference plate 434 on the upper base 42, and observing the reference plate 434 provided on the upper base 42 by the die observation camera 431, the origin position, the magnification, the directions (rotations) and orthogonality of the X-axis and the Y-axis of the wafer stage 43 may be guaranteed. Instead of performing calibration by observing the reference plate 434, for example, calibration may be performed by an abutting operation to a reference surface, or accurate positioning may be performed using a position measurement device such as a white interferometer that guarantees an absolute value.

Figure 3:
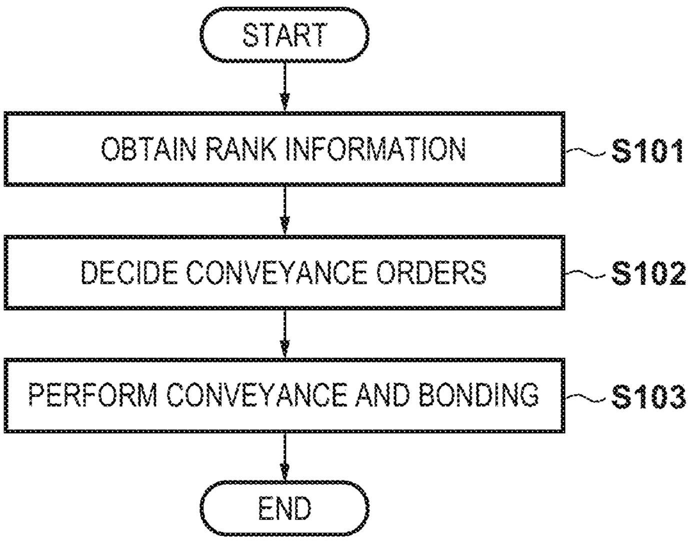
FIG. 3 is a flowchart for explaining a bonding operation in the first embodiment.

With reference to FIG. 3, an operation of the bonding apparatus BD in the first embodiment, that is, a bonding operation (bonding method) of bonding the die 51 (first object) to the die 61 (second object) of the wafer 6 will be described. In this embodiment, the conveyance order of the dicing frames 5 and the conveyance order of the wafers 6 are decided such that the die 51 and the die 61 are bonded in descending order of the priority order of the combination of the rank of the die 51 and the rank of the die 61. Then, the dicing frame 5 and the wafer 6 are conveyed in accordance with the decided conveyance orders, and the die 51 is bonded to the die 61. Note that the priority order is set (decided in advance) such that the combination in which the rank of the die 51 and the rank of the die 61 are more similar has a higher priority order. For example, the priority order is set such that the combination in which the rank of the die 51 and the rank of the die 61 are the same has the highest priority order. More specifically, in a case in which the rank of the die 51 and the rank of the die 61 are expressed by "non-defective" or "defective", the priority order is set such that the highest priority is given to the combination in which both the die 51 and the die 61 are non-defective dies and the combination in which both the die 51 and the die 61 are defective dies. The die 51 is bonded to the defective die 61 because it is necessary to bond (arrange) the die 51 even to the defective die 61 to suppress a deterioration in uniformity in the molding and bonding processes. Here, if one of the die 51 and the die 61 is a defective die, the bonded object (device) obtained by bonding the die 51 to the die 61 is a defective object. In this manner, if a non-defective die and a defective die are bonded, the non-defective die is wasted and the yield decreases. Therefore, in order not to waste a non-defective die, the priority order is preferably set such that the defective die 51 is bonded to the defective die 61.

In step S101, rank information of the plurality of dicing frames 5 to be conveyed, which are stored in the frame magazine 71 and supplied to the bonding apparatus BD, and the plurality of wafers 6 to be conveyed, which are stored in the wafer pod 81 and supplied to the bonding apparatus BD, is obtained. In the manufacture of a semiconductor, after a semiconductor device is manufactured on a wafer, for example, a prober determines whether the device is a non-defective device or a defective device. In some cases, the device is classified (classified into multiple ranks) not only based on whether it is a non-defective device or a defective device, but also based on the performance (characteristic) such as speed. In this manner, the rank information is the data indicating the rank which is the classification determined from the class including the quality (data concerning the quality) of each of the dies 51 and 61. Hence, in this embodiment, the rank information, which includes data indicating ranks to which the respective dies 51 belong for each of the plurality of dicing frames 5 and data indicating ranks to which the respective dies 61 belong for each of the plurality of wafers 6, is obtained. As has been described above, the rank information is obtained from an external apparatus such as the prober different from the bonding apparatus BD before starting conveyance of the dicing frame 5 and the wafer 6.

Figures 4, 5:
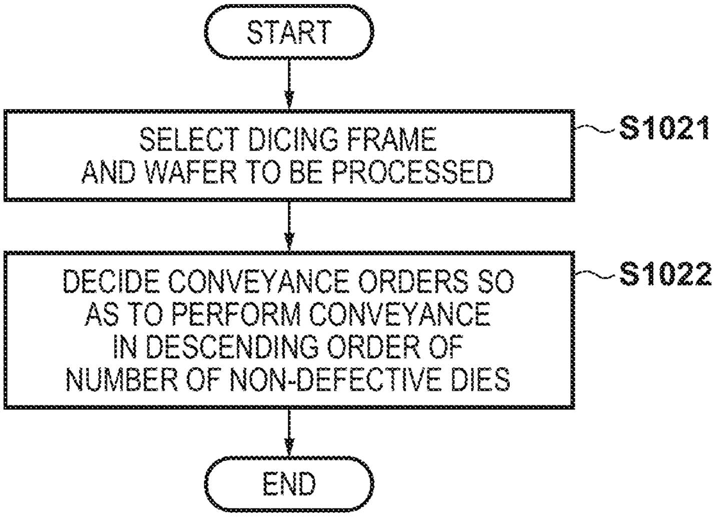
FIG. 4 is a view showing an example of rank information.
FIG. 5 is a flowchart for explaining processing of deciding the conveyance order of dicing frames and the conveyance order of wafers.

A case in which two dicing frames D11 and D12 are stored in the frame magazine 71, and three wafers W11, W12, and W13 are stored in the wafer pod 81 will be described below as an example. In this case, the rank information obtained in step S101 includes data indicating the number of non-defective/defective dies 51 (the number of non-defective dies and the number of defective dies) for each of the dicing frames D11 and D12, as shown in FIG. 4. The rank information obtained in step S101 also includes data indicating the number of non-defective/defective dies 61 (the number of non-defective dies and the number of defective dies) for each of the wafers W11, W12, and W13, as shown in FIG. 4. Note that the number of the dies 61 formed on each of the wafers W11, W12, and W13 is basically larger the number of the dies 51 held by each of the dicing frames D11 and D12.

In step S102, based on the rank information obtained in step S101, the order (conveyance order) of conveying the dicing frames D11 and D12, and the order (conveyance order) of conveying the wafers W11, W12, and W13 are decided. For example, based on the rank information shown in FIG. 4, each of the dicing frames D11 and D12 and each of the wafers W11, W12, and W13 are evaluated based on an evaluation criterion decided in advance, and the conveyance orders thereof are decided. Here, the conveyance orders are decided such that, as the evaluation criterion, bonding of the die 51 and the die 61 is performed in descending order of the priority order described above, more specifically, the bonding is performed in a combination of non-defective dies 51 and 61 and in a combination of defective dies 51 and 61.

In step S103, in accordance with the conveyance orders decided in step S102, the dicing frames D11 and D12 are conveyed to the pickup unit 3, the wafers W11, W12, and W13 are conveyed to the bonding unit 4, and the die 51 is bonded to the die 61. At this time, the die 51 is bonded to the die 61 such that non-defective dies are bonded together and defective dies are bonded together. If bonding cannot be performed in the combination of non-defective dies or in the combination of defective dies, bonding is performed in a combination of the non-defective die 51 and the defective die 61 or in a combination of the defective die 51 and the non-defective die 61. Note that the bonding orders of the individual die 51 and die 61 are arbitrary as long as the number of bonds in the combination of non-defective dies and the number of bonds in the combination of defective dies are maximized.

In step S103, if all the dies 51 held by the dicing frame 5 have been bonded, this dicing frame 5 is exchanged to the next dicing frame 5. Similarly, if all the dies 61 formed on the wafer 6 have been bonded, this wafer 6 is exchanged to the next wafer 6. At this time, the dicing frame 5 and wafer 6 to be conveyed next follow the conveyance orders decided in step S102.

If the rank information shown in FIG. 4 is obtained, in step S102, for example, the conveyance orders are decided such that the dicing frames are conveyed in the order of the dicing frames D12 and D11 and the wafers are conveyed in the order of the wafers W11, W12, and W13. With this, in step S103, all the dies 51 and 61 can be bonded in the combination of non-defective dies and in the combination of defective dies. Even if the dicing frames are conveyed in the order of the dicing frames D11 and D12 and the wafers are conveyed in the order of the wafers W11, W13, and W12, all the dies 51 and 61 can be bonded in the combination of non-defective dies and in the combination of defective dies. In this manner, if there are a plurality of conveyance orders that maximize the number of bonds in the combination of non-defective dies and the number of bonds in the combination of defective dies, one of these conveyance orders may be decided in step S102.

In step S102, it is not always necessary to decide the conveyance order that maximizes the number of bonds in the combination of non-defective dies and the number of bonds in the combination of defective dies. In step S102, the conveyance order that can increase, as compared to a case where the conveyance order is not explicitly decided, the number of bonds in the combination of non-defective dies and the number of bonds in the combination of defective dies may be decided. Note that an arbitrary method is used as the specific method of deciding the conveyance order.

In this embodiment, the rank information has been described as two-level ranking data indicating the quality of each of the dies 51 and 61. However, as has been described above, the number of ranking levels may be an arbitrary number of three or more, and the criterion may be an arbitrary criterion other than the quality.

Further, in this embodiment, the combination of the same rank such as the combination of non-defective dies and the combination of the defective dies is prioritized, but it is not always necessary to prioritize the combination of the same rank. For example, within the range where a rank of the die 51 and the rank of the die 61 are similar (that is, bonding of die 51 and die 61 is allowed), a combination of arbitrary ranks may be prioritized. It is only required that the priority order of the combination of arbitrary ranks is uniquely decided.

With reference to FIG. 5, the processing (step S102) of deciding the conveyance order of the dicing frames 5 and the conveyance order of the wafers 6 will more specifically be described. Here, assume that the total number of the wafers 6 stored in the wafer pod 81 (supplied to the bonding apparatus BD) is N, and the total number of the dicing frames 5 stored in the frame magazine 71 (supplied to the bonding apparatus BD) is M. Further, let Cg be the total number of the non-defective dies 61 formed on N wafers 6, and Dg be the total number of the non-defective dies 51 held by M dicing frames 5.

In step S1021, the dicing frames 5 and the wafers 6 to be processed are selected. More specifically, m dicing frames 5 satisfying "Cg≤the total number of the non-defective dies 51 held by m dicing frames 5" are selected from M dicing frames 5, and n=N wafers, that is, all the wafers 6 are selected. In a case where the condition is not satisfied even if M dicing frames 5 are selected, n wafers 6 satisfying "Dg≤the total number of the non-defective dies 61 formed on n wafers", and m=M dicing frames 5, that is, all the dicing frames 5 are selected.

In step S1022, for n wafers 6 and m dicing frames 5 selected in step S1021, the conveyance orders are decided such that the wafers 6 and dicing frames 5 are conveyed in descending order of the number of non-defective dies. In other words, the conveyance order of n wafers 6 and the conveyance order of m dicing frames 5 are decided such that the wafers 6 are conveyed in descending order of the number of non-defective dies 61 and the dicing frames 5 are conveyed in descending order of the number of non-defective dies 51.

For example, consider a case where m dicing frames 5 are the dicing frames D11 and D12, n wafers 6 are wafers W11, W12, and W13, and their numbers of non-defective dies are as described by the rank information shown in FIG. 4. In this case, by the processing illustrated in FIG. 5, the conveyance order of the dicing frames 5 is decided as the order of the dicing frames D11 and D12, and the conveyance order of the wafers 6 is decided as the order of the wafers W13, W12, and W11.

Note that, in this embodiment, the conveyance order of the wafers 6 and the conveyance order of the dicing frames 5 are decided such that they are conveyed in descending order of the number of non-defective dies, but the present invention is not limited to this. For example, in step S1022, for n wafers 6 and m dicing frames 5 selected in step S1021, the conveyance orders may be decided such that they are conveyed in descending order of the number of defective dies.

In this manner, according to this embodiment, it is possible to increase the number of bonds of the non-defective die 51 and the non-defective die 61 and the number of bonds of the defective die 51 and the defective die 61.

Accordingly, it is possible to suppress a decrease in yield (improve the yield) of a bonded object (device) obtained by bonding the die 51 and the die 61.

Second Embodiment

The first embodiment premises that each of the individual dicing frame 5 and wafer 6 is conveyed only once and used for bonding of the die 51 and the die 61. On the other hand, by performing bonding of the die 51 and the die 61 while exchanging the dicing frame 5 and the wafer 6, the number of bonds of the non-defective die 51 and the non-defective die 61 and the number of bonds of the defective die 51 and the defective die 61 can be maximized. However, as the number of exchanges of the dicing frame 5 and the wafer 6 increases, the overhead required for the exchanges deteriorates the productivity of the bonding apparatus BD. In this embodiment, a bonding method capable of increasing the number of bonds of a non-defective die 51 and a non-defective die 61 and the number of bonds of the defective die 51 and the defective die 61 without deteriorating the productivity of a bonding apparatus BD will be described.

Figures 6, 7:
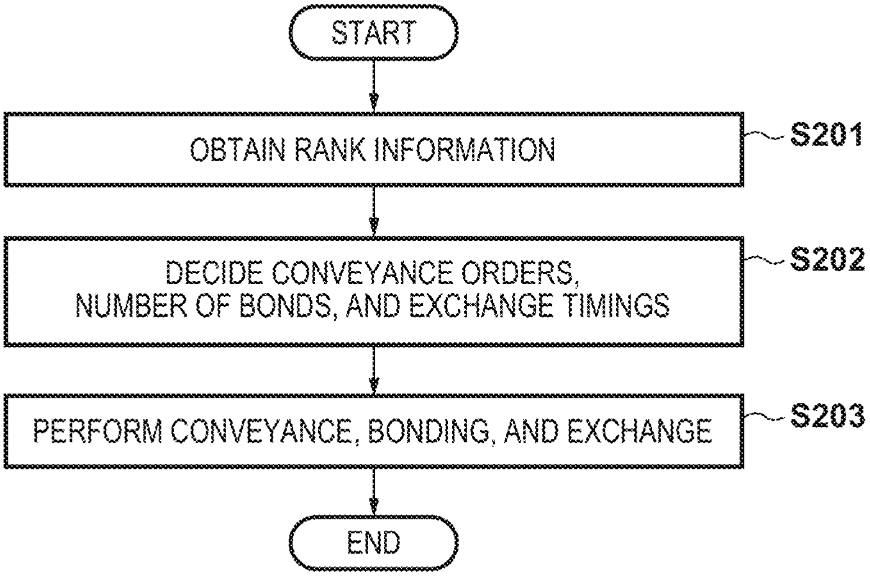
FIG. 6 is a flowchart for explaining a bonding operation in the second embodiment.
FIG. 7 is a view showing an example of rank information.

FIG. 6 is a flowchart for explaining an operation of the bonding apparatus BD in the second embodiment, that is, a bonding operation (bonding method) of bonding the die 51 (first object) to the die 61 (second object) on a wafer 6. In this embodiment, the conveyance order of dicing frames 5 and the conveyance order of the wafers 6, the number of bonds of the die 51 and the die 61, and the exchange timing of each of the dicing frame 5 and the wafer 6 are decided such that the non-defective dies 51 and 61 are bonded together and the defective dies 51 and 61 are bonded together. In accordance with the decided conveyance orders and exchange timings, the dicing frame 5 and the wafer 6 are conveyed and exchanged, and the dies 51 are respectively bonded to the dies 61 so as to achieve the decided number of bonds.

In step S201, rank information of the plurality of dicing frames 5 to be conveyed, which are stored in a frame magazine 71 and supplied to the bonding apparatus BD, and the plurality of wafers 6 to be conveyed, which are stored in a wafer pod 81 and supplied to the bonding apparatus BD, is obtained. The rank information is obtained as in step S101 described in the first embodiment, so a detailed description will be omitted here.

In step S202, based on the rank information obtained in step S201, the conveyance order of the dicing frames 5 and the conveyance order of the wafers 6, the number of bonds of the die 51 and the die 61, and the exchange timing of each of the dicing frame 5 and the wafer 6 are decided. For example, the conveyance order of the dicing frames 5 and the conveyance order of the wafers 6 are decided such that the non-defective die 51 and the non-defective die 61 are bonded together and the defective die 51 and the defective die 61 are bonded together. Similarly, the number of bonding the die 51 and the die 61 (the number of bonds), and the timing of exchanging each of the dicing frame 5 and the wafer 6 (exchange timing) are decided such that the non-defective die 51 and the non-defective die 61 are bonded together and the defective die 51 and the defective die 61 are bonded together.

In step S203, in accordance with the conveyance orders and exchange timings decided in step S202, the dicing frame 5 and the wafer 6 are conveyed and exchanged, and the dies 51 are respectively bonded to the dies 61 so as to achieve the decided number of bonds. More specifically, in accordance with the conveyance orders decided in step S202, the dicing frame 5 is conveyed to a pickup unit 3, and the wafer 6 is conveyed to a bonding unit 4. Then, bonding of the non-defective die 51 to the non-defective die 61 and bonding of the defective die 51 to the defective die 61 are performed so as to achieve the number of bonds decided in step S202. Note that the bonding orders of the individual dies 51 and 61 are arbitrary as long as the number of bonds decided in step S202 is achieved. Then, in accordance with the exchange timings decided in step S202, the dicing frame 5 and the wafer 6 are exchanged. Note that the exchange timing is not limited to the timing when all the dies 51 held by the dicing frame 5 have been bonded or the timing when all the dies 61 formed on the wafer 6 have been bonded. The next dicing frame 5 and wafer 6 conveyed when exchanging the dicing frame 5 and wafer 6 follow the conveyance orders decided in step S202.

With reference to FIG. 7, a specific example of deciding the conveyance order of the dicing frames 5 and the conveyance order of the wafers 6, the number of bonds of the die 51 and the die 61, and the exchange timing of each of the dicing frame 5 and the wafer 6 will be described. FIG. 7 is a view showing an example of the rank information obtained in step S201. As shown in FIG. 7, the rank information obtained in step S201 includes, for example, data indicating the number of non-defective/defective dies 51 (the number of non-defective dies and the number of defective dies) for each of dicing frames D21 and D22. The rank information obtained in step S201 also includes data indicating the number of non-defective/defective dies 61 (the number of non-defective dies and the number of defective dies) for each of wafers W21, W22, and W23.

In this embodiment, first, the dicing frame D21 and the wafer W21 are conveyed. Then, 18 (the number of bonds) non-defective dies 51 are respectively bonded to the non-defective dies 61, and 2 (the number of bonds) defective dies 51 are respectively bonded to the defective dies 61. At this point, all the dies 61 formed on the wafer W21 have been bonded, so the wafer W21 is exchanged to the wafer W22. On the other hand, the unbonded dies 51, which have not been used for bonding, still remain in the dicing frame D21, but the dicing frame D21 is also exchanged to the dicing frame D22 at the timing of exchanging the wafer W21 to the wafer W22 (that is, at the same timing as the wafer exchange).

Then, between the dicing frame D22 and the wafer W22, 17 (the number of bonds) non-defective dies 51 are respectively bonded to the non-defective dies 61, and three (the number of bonds) defective dies 51 are respectively bonded to the defective dies 61. At this point, all the dies 61 formed on the wafer W22 have been bonded, so the wafer W22 is exchanged to the wafer W23.

Then, between the dicing frame D22 and the wafer W23, seven (the number of bonds) non-defective dies 51 are respectively bonded to the non-defective dies 61, and three (the number of bonds) defective dies 51 are respectively bonded to the defective dies 61. At this point, all the dies 51 held by the dicing frame D22 have been bonded, so the dicing frame D22 is exchanged to the dicing frame D21.

Finally, between the dicing frame D21 and the wafer W23, five (the number of bonds) non-defective dies 51 are respectively bonded to the non-defective dies 61, and five (the number of bonds) defective dies 51 are respectively bonded to the defective dies 61.

By deciding, in the manner described above, the conveyance order of the dicing frames 5 and the conveyance order of the wafers 6, the number of bonds of the die 51 and the die 61, and the exchange timing of each of the dicing frame 5 and the wafer 6, all the non-defective dies 51 can be bonded to the non-defective dies 61, and all the defective dies 51 can be bonded to the defective dies 61.

In the example shown in FIG. 7, the wafer 6 needs to be exchanged at least twice, and the dicing frame 5 needs to be exchanged at least once. The dicing frame 5 is exchanged during bonding of the dies 61 formed on the second conveyed wafer 6. However, in the specific example described above, the wafer 6 is exchanged twice, and the dicing frame 5 is also exchanged twice. In this example, the dicing frame 5 is exchanged at the same timing as the wafer 6. With this, the time required to exchange the wafer 6 can cover (hide) the time required to exchange the dicing frame 5. Therefore, even as compared to a case of minimizing the number of times the dicing frame 5 is exchanged, productivity is not deteriorated. Note that, if there are a plurality of conveyance orders and exchange timings that maximize the number of bonds in the combination of non-defective dies and the number of bonds in the combination of defective dies, and do not deteriorate productivity, one of these conveyance orders and one of these exchange timings may be decided in step S202.

In step S202, it is not always necessary to decide the conveyance order and exchange timing that maximize the number of bonds in the combination of non-defective dies and the number of bonds in the combination of defective dies. In step S202, the conveyance order and exchange timing that can increase, as compared to a case where the conveyance order and exchange timing are not explicitly decided, the number of bonds in the combination of non-defective dies and the number of bonds in the combination of defective dies may be decided. Note that an arbitrary method is used as the specific method of deciding the conveyance order and exchange timing.

If yield is prioritized over productivity, it is not always necessary to decide the conveyance order and exchange timing that do not deteriorate productivity. For example, within the range of permissible productivity deterioration, the conveyance order and exchange timing may be decided which prioritize increasing the number of bonds in the combination of non-defective dies and the number of bonds in the combination of the defective dies. Note that an arbitrary method is used as the specific method of deciding the conveyance order and exchange timing.

In this embodiment, the rank information has been described as two-level ranking data indicating the quality of each of the dies 51 and 61. However, as has been described above, the number of ranking levels may be an arbitrary number of three or more, and the criterion may be an arbitrary criterion other than the quality.

The physical configuration of the bonding apparatus for implementing the bonding operation (FIG. 6) in this embodiment is similar to the configuration of the bonding apparatus BD shown in FIG. 1, but the bonding apparatus needs to be capable of exchanging the dicing frame 5 and the wafer 6 at the same time. Therefore, in this embodiment, the conveyance path for conveying the dicing frame 5 and the conveyance path for conveying the wafer 6 should be independent of each other in the bonding apparatus BD shown in FIG. 1.

Figure 8:
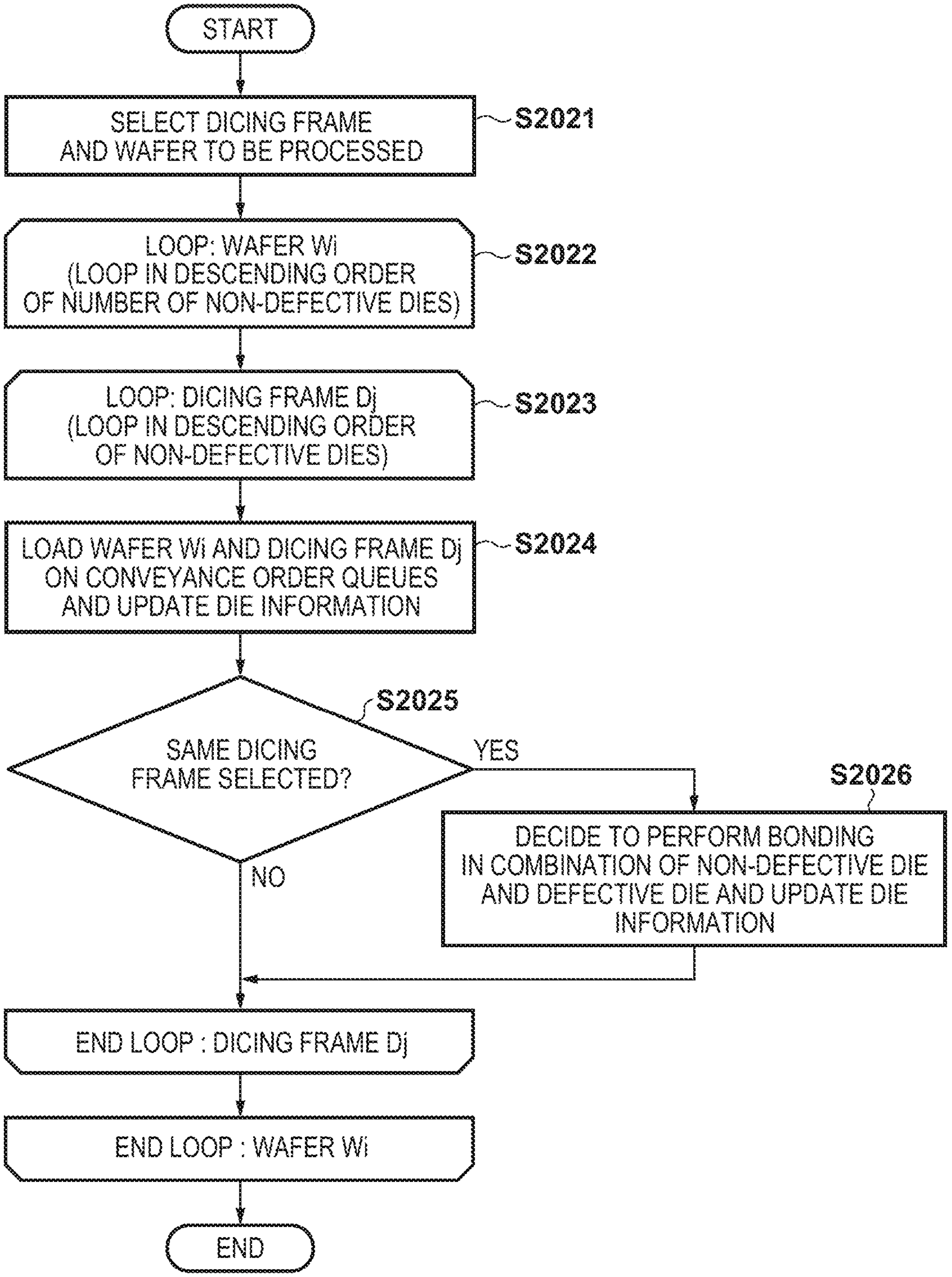
FIG. 8 is a flowchart for explaining processing of deciding the conveyance orders of dicing frames and wafers, the number of bonds thereof, and the exchange timings thereof.

With reference to FIG. 8, the processing (step S202) of deciding the conveyance order of the dicing frames 5 and the conveyance order of the wafers 6, the number of bonds of the die 51 and the die 61, and the exchange timing of each of the dicing frame 5 and the wafer 6 will be more specifically described. Here, assume that the total number of the wafers 6 stored in the wafer pod 81 (supplied to the bonding apparatus BD) is N, and the total number of the dicing frames 5 stored in the frame magazine 71 (supplied to the bonding apparatus BD) is M. Further, let Cg be the total number of the non-defective dies 61 formed on N wafers 6, and Dg be the total number of the non-defective dies 51 held by M dicing frames 5.

In step S2021, the dicing frames 5 and the wafers 6 to be processed are selected. The dicing frames 5 and wafers 6 to be processed are selected as in step S1021 described in the first embodiment, so a detailed description will be omitted here. In the following description, n wafers 6 and m dicing frames 5 selected in step S2021 are to be processed.

In step S2022, repetitive (loop) processing is performed on n wafers 6 in descending order of the number of non-defective dies 61. The condition for ending the repetitive processing is that the processing has been performed on all of n wafers 6. In the repetitive processing, the wafer 6 of interest is referred to as a wafer Wi. Among the dies 61 formed on the wafer Wi, the number of unbonded non-defective dies, which have not been used for bonding, is indicated by Wig, and the number of unbonded defective dies, which have not been used for bonding, is indicated by Wib. Wig and Wib are managed as die information.

In step S2023, repetitive (loop) processing is performed on m dicing frames 5 in descending order of the number of non-defective dies 51. The condition for ending the repetitive processing is that all the dies 61 formed on the wafer Wi of interest are decided to be bonded, or all the dies 51 held by m dicing frames 5 are decided to be bonded, or both conditions are satisfied. In the repetitive processing, the dicing frame 5 of interest is referred to as a dicing frame Dj. Among the dies 51 held by the dicing frame Dj, the number of unbonded non-defective dies, which have not been used for bonding, is indicated by Djg, and the number of unbonded defective dies, which have not been used for bonding, is indicated by Djb. Djg and Djb are managed as die information.

In step S2024, the wafer Wi and the dicing frame Dj are loaded on a wafer conveyance order queue and a dicing frame conveyance order queue, respectively, and the loading order on each conveyance order queue is decided as the conveyance order. Regarding the dicing frame Dj, the same individual may be the dicing frame of interest (target object) over multiple repetitive processing operations. If the dicing frame already loaded on the trailing end of the conveyance order queue is the same individual as the dicing frame Dj of interest in the current repetitive processing, the dicing frame Dj is not loaded on the conveyance order queue. Then, for the wafer Wi, the value of the unbonded non-defective die count Wig (that is, die information) is updated assuming that bonding has been performed. More specifically, if "Wig≥Djg", the value is updated to "Wig=Wig−Djg", and if "Wig<Djg", the value is updated to "0". The value of the unbonded defective die count Wib (that is, die information) is similarly updated. More specifically, if "Wib≥Djb", the value is updated to "Wib=Wib−Djb", and if "Wib<Djb", the value is updated to "0". Similarly, for the dicing frame Dj, the value of the unbonded non-defective die count Djg (that is, die information) is updated assuming that bonding has been performed. More specifically, if "Wig≥Djg", the value is updated to "0", and if "Wig<Djg", the value is updated to "Djg=Djg−Wig". The value of the unbonded defective die count Djb (that is, die information) is similarly updated. More specifically, if "Wib≥Djb", the value is updated to "0", and if "Wib<Djb", the value is updated to "Djb=Djb−Wib".

The processing in step S2024 means the following three points.

1: For a combination of the conveyed wafer Wi and dicing frame Dj, bonding of the non-defective die 61 and the non-defective die 51 and bonding of the defective die 61 and the defective die 51 are decided as much as possible.

2: If all the dies 61 formed on the wafer Wi are decided to be bonded, the dicing frame Dj is also exchanged at the same time as the wafer Wi is exchanged. The dicing frame with the largest unbonded non-defective die count Djg at this time is selected as the next dicing frame Dj to be conveyed (of interest).

3: If the dicing frame with the largest unbonded non-defective die count Djg is the same individual, the dicing frame Dj is not exchanged and the wafer Wi alone is exchanged.

In step S2025, it is determined whether a dicing frame Dj+1 of interest (to be processed) in the next repetitive processing is the same individual as the dicing frame Dj of interest in the current repetitive processing (that is, whether the dicing frame Dj of the same individual is selected). Since the value of the unbonded non-defective die count Djg is updated in step S2024, in the next repetitive processing, the dicing frame Dj of the same individual may become the dicing frame of interest. This means that, in the next repetitive processing, if the dicing frame Dj of the same individual is selected as the dicing frame of interest, bonding of non-defective dies and bonding of defective dies cannot be performed. Therefore, if the dicing frame Dj of the same individual is selected, the process transitions to step S2026. On the other hand, if the dicing frame Dj of the same individual is not selected, the process transitions to the next repetitive processing in step S2023.

In step S2026, since bonding in a combination of non-defective dies and bonding in a combination of defective dies cannot be performed between the wafer Wi and the dicing frame Dj, it is decided to perform bonding in a combination of a non-defective die and a defective die. Then, the values of the unbonded non-defective die count Wig, the unbonded defective die count Wib, the unbonded non-defective die count Djg, and the unbonded defective die count Djb (that is, die information) are updated assuming that bonding in the combination of the non-defective die and the defective die has been performed. More specifically, for Wig, if "Wig≥Djb", the value is updated to "Wig=Wig−Djb", and if "Wig<Djb", the value is updated to "0". For Wib, if "Wib≥Djg", the value is updated to "Wib=Wib−Djg", and if "Wib<Djg", the value is updated to "0". Similarly, for Djg, if "Wib≥Djg", the value is updated to "0", and if "Wib<Djg", the value is updated to "Djg=Djg−Wib". For Djb, if "Wig≥Djb", the value is updated to "0", and if "Wig<Djb", the value is updated to "Djb=Djb−Wig". If the processing in step S2026 ends, the process transitions to the next repetitive processing in step S2023.

In the repetitive processing in steps S2022 to S2026, all the dies 61 formed on n wafers 6 are decided to be bonded, and thus the processing in step S202 is completed.

In a case where the number of non-defective/defective dies of each dicing frame 5 and that of each wafer 6 supplied to the bonding apparatus BD are as shown in FIG. 7, the processing (FIG. 5) described in the first embodiment cannot bond all the dies 51 and 61 in the combination of non-defective dies and in the combination of defective dies. On the other hand, in the processing (FIG. 8) described in this embodiment, since the conveyance orders, the number of bonds, and the exchange timings are properly decided as described above, it is possible to bond all the dies 51 and 61 in the combination of non-defective dies and in the combination of defective dies.

In this manner, according to this embodiment, it is possible to increase the number of bonds of the non-defective die 51 and the non-defective die 61 and the number of bonds of the defective die 51 and the defective die 61. Accordingly, it is possible to suppress a decrease in yield (improve the yield) of a bonded object (device) obtained by bonding the die 51 and the die 61.

Third Embodiment

Depending on the number of non-defective/defective dies 51 held by a dicing frame 5 and the number of non-defective/defective dies 61 formed on a wafer 6, even the processing (FIG. 8) described in the second embodiment cannot always increase the number of bonds of non-defective dies together and the number of bonds of defective dies together. In this case, the result of the processing (FIG. 5) described in the first embodiment, the result of the processing (FIG. 8) described in the second embodiment, and the result of a case where the conveyance order is not explicitly decided are simulated, and the processing that produces the largest number of bonds of non-defective dies together and the largest number of bonds of defective dies together is preferably selected. Alternatively, as long as it is practically calculative, a round-robin simulation may be performed while changing the conveyance order and the exchange timing, and the processing that produces the largest number of bonds of non-defective dies together and the largest number of bonds of defective dies together may be selected.

Fourth Embodiment

Since the number of dies 51 held by a dicing frame 5 is generally different from the number of dies 61 (the dies to which the dies 51 are bonded) formed on a wafer 6, in a bonding process, the exchange timing of the dicing frame 5 does not synchronize with the exchange timing of the wafer 6. In addition, since the number of the dicing frames 5 stored in a frame magazine 71 is different from the number of the wafers 6 stored in a wafer pod 81, the exchange timing of the frame magazine 71 does not synchronize with the exchange timing of the wafer pod 81. Hence, at the timing when all the dies 51 held by all the dicing frames 5 stored in and supplied from the frame magazine 71 have been bonded, there may be unbonded dies 61 remaining on the wafer 6 stored in and supplied from the wafer pod 81. In this case, the dies 51 held by the dicing frame 5 stored in the next frame magazine 71 to be supplied to a bonding apparatus BD may be bonded to the unbonded dies 61 remaining on the wafer 6. In this case, the processing (FIG. 5 or 8) described in the first or second embodiment may be performed while using, as parameters, the dicing frames 5 existing in the bonding apparatus BD when the next frame magazine 71 is supplied to the bonding apparatus BD. This also applies to a case where the unbonded dies 51 remain in the dicing frame 5 stored in and supplied from the frame magazine 71 at the timing when all the dies 61 formed on all the wafers 6 stored in and supplied from the wafer pod 81 have been bonded.

In this manner, according to this embodiment, it is possible to increase the number of bonds of the non-defective die 51 and the non-defective die 61 and the number of bonds of the defective die 51 and the defective die 61. Accordingly, it is possible to suppress a decrease in yield (improve the yield) of a bonded object (device) obtained by bonding the die 51 and the die 61.

Fifth Embodiment

Assume a case where a bonding apparatus BD includes a plurality of frame supply units 7 and a plurality of wafer supply units 8. In this case, in the bonding apparatus BD, while performing a bonding process of bonding a die 51 held by a dicing frame 5 to a die 61 formed on a wafer 6, a new frame magazine 71 or a new wafer pod 81 may be supplied. In this case, the processing (FIG. 5 or 8) described in the first or second embodiment may be performed while using, as parameters, all of the dicing frame 5 and wafer 6 already existing in the bonding apparatus BD and the newly supplied dicing frame 5 and wafer 6. It is not always necessary to complete the conveyance orders decided in the first embodiment, and the conveyance orders, number of bonds, and exchange timings decided in the second embodiment. For example, these factors may be updated, as appropriate, while using, as parameters, all of the dicing frames 5 and wafers 6 existing in the bonding apparatus BD.

Sixth Embodiment

So far, the description has been given premising that all the dies 51 held by the dicing frames 5 supplied to the bonding apparatus BD and all the dies 61 formed on the wafers 6 supplied to the bonding apparatus BD are bonded. The reason why the die 51 is bonded to the defective die 61 is that, as has been described above, it is necessary to bond (arrange) the die 51 to even the defective die 61 to suppress a deterioration in uniformity in the molding and bonding processes. On the other hand, it is not always necessary to use all of the defective dies 51 for bonding. For example, assume a case where, at the timing when all dies 61 formed on all wafers 6 supplied to a bonding apparatus BD have been bonded, unbonded dies 51 not bonded to the dies 61 remain in the dicing frame 5 simultaneously supplied to the bonding apparatus BD. In this case, if all of the unbonded dies 51 remaining in the dicing frame 5 are defective (predetermined rank), all of them may not be used for bonding to the dies 61. Then, the dicing frame 5 with the unbonded dies 51 remaining therein is returned to a frame magazine 71. The frame magazine 71 may be exchanged, or the dicing frame may be unloaded from the bonding apparatus BD.

In addition to not using the defective dies 51 for bonding, which eventually remain in the dicing frame 5, before deciding the conveyance orders of the dicing frames 5 and the wafers 6, a certain number of defective dies 51 may be excluded from the parameter, and then the conveyance order may be decided.

In this embodiment, the die 51 not used for bonding has been described as the defective die. However, in a case of classifying into three or more ranks, the die 51 belonging to the rank equal to or lower than a predetermined rank may not be used for bonding.

Seventh Embodiment

In the first and second embodiments, the example has been described in which the rank information obtained from the external apparatus such as a prober is employed as the index of the priority order. However, the rank information can be updated, as appropriate. For example, even if a die is determined in advance as a non-defective die by the prober, a foreign substance or the like may adhere during conveyance to a bonding apparatus BD and cause a bonding defect. In such a case, in addition to the rank information, foreign substance information indicating presence/absence of adhesion of a foreign substance to the die may be obtained. Even if a die is determined to be non-defective, if a foreign substance adheres to it, the rank information may be updated to indicate “defective die”. Note that the foreign substance information may be an image obtained by capturing the die, and the adhesion of a foreign substance may be determined from the image.

Instead of directly using the rank information obtained from the external apparatus, the rank information may be updated using another information. For example, there is a case where, in order to improve productivity, dies to premeasure the rank are thinned out, thereby obtaining rank information including the ranks of some dies in the dicing frame and wafer. In this case, the rank of individual die may be decided by statistically processing the ranks of the dies included in the rank information to analogize and interpolate the ranks of other dies. The information used to decide the final rank and the method used to decide the rank are arbitrary.

Eighth Embodiment

A method of manufacturing an article (a semiconductor IC element, a liquid crystal element, a MEMS, or the like) using the bonding apparatus BD in the above-described embodiments will be described. The manufacturing method includes a step of preparing a plurality of carriers (dicing frames 5) each holding a plurality of separated first objects (dies 51), and a step of preparing a plurality of substrates (wafers 6) with a plurality of second objects (dies 61) formed on each substrate. The manufacturing method further includes a step of forming a bonded object by bonding the first object and the second object using a bonding apparatus BD (bonding method (bonding operation)), and a step of manufacturing an article by processing the bonded object in another known process. The other known process includes probing, dicing, bonding, packaging, and the like. The article manufacturing method according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2023-118516 filed on Jul. 20, 2023, which is hereby incorporated by reference herein in its entirety.

What is claimed is:

1. A bonding method of conveying a plurality of carriers and a plurality of substrates to a bonding apparatus and boding a first object and a second object, the plurality of carriers each holding a plurality of first objects, the plurality of substrates each having a plurality of second objects formed thereon, the method comprising:

obtaining rank information including data indicating ranks of the respective first objects for each of the plurality of carriers and data indicating ranks of the respective second objects for each of the plurality of substrates;

deciding, based on the rank information, a conveyance order of the plurality of carriers and a conveyance order of the plurality of substrates; and conveying the plurality of carriers and the plurality of substrates to the bonding apparatus in accordance with the conveyance orders decided in the deciding, and bonding the first object and the second object.

2. The method according to claim 1, wherein in the deciding, each of the plurality of carriers and each of the plurality of substrates are evaluated based on the rank information and an evaluation criterion decided in advance, thereby deciding the conveyance order of the plurality of carriers and the conveyance order of the plurality of substrates.

3. The method according to claim 2, wherein the evaluation criterion includes a priority order decided in advance in accordance with a combination of the rank of the first object and the rank of the second object, and in the deciding, the conveyance order of the plurality of carriers and the conveyance order of the plurality of substrates are decided such that the first object and the second object are bonded in descending order of the priority order of the combination.

4. The method according to claim 3, wherein the priority order is decided in advance such that a combination in which the rank of the first object and the rank of the second object are more similar has a higher priority order.

5. The method according to claim 4, wherein the priority order is decided in advance such that a combination in which the rank of the first object and the rank of the second object are the same has a highest priority order.

6. The method according to claim 1, wherein the rank information includes data concerning a quality of the first object and data concerning a quality of the second object, in the deciding, the conveyance order of the plurality of carriers and the conveyance order of the plurality of substrates are decided such that the plurality of carriers are conveyed to the bonding apparatus in descending order of the number of non-defective first objects and the plurality of substrates are conveyed to the bonding apparatus in descending order of the number of non-defective second objects, and in the bonding, the first object and the second object are bonded such that non-defective objects are bonded together and defective objects are bonded together.

7. The method according to claim 1, wherein in the deciding, based on the number of the first objects for each rank among the plurality of first objects held by the carrier and the number of the second objects for each rank among the plurality of second objects formed on the substrate, a timing of exchanging the carrier and a timing of exchanging the substrate are further decided.

8. The method according to claim 7, wherein in the deciding, the timing of exchanging the carrier and the timing of exchanging the substrate are decided such that the carrier and the substrate are simultaneously exchanged.

9. The method according to claim 1, wherein in the obtaining, the rank information is obtained from an external apparatus different from the bonding apparatus before starting conveyance of the plurality of carriers and the plurality of substrates.

10. The method according to claim 1, wherein in the bonding, the first object and the second object are bonded such that all of the plurality of second objects are bonded with the first objects for each of the plurality of substrates.

11. The method according to claim 10, wherein in the bonding, if all of the first objects unbonded to the second object among the plurality of first objects held by the carrier have a predetermined rank, the all of the first objects are not used for bonding to the second object.

12. The method according to claim 1, wherein the number of the second objects formed on each of the plurality of substrates is larger than the number of the first objects held by each of the plurality of carriers.

13. A bonding apparatus that conveys a plurality of carriers and a plurality of substrates and bonds a first object and a second object, the plurality of carriers each holding a plurality of first objects, the plurality of substrates each having a plurality of second objects formed thereon, the apparatus comprising:

an obtainment unit configured to obtain rank information including data indicating ranks of the respective first objects for each of the plurality of carriers and data indicating ranks of the respective second objects for each of the plurality of substrates;

a deciding unit configured to decide, based on the rank information, a conveyance order of the plurality of carriers and a conveyance order of the plurality of substrates; and a bonding unit configured to convey the plurality of carriers and the plurality of substrates to the apparatus in accordance with the conveyance orders decided by the decision unit, and bond the first object and the second object.

14. An article manufacturing method comprising:

preparing a plurality of carriers each holding a plurality of first objects;

preparing a plurality of substrates with a plurality of second objects formed on each substrate;

forming a bonded object by bonding the first object to the second object in accordance with a bonding method defined in claim 1; and manufacturing an article by processing the bonded object.

* * * * *